United States Patent [19]

Takahashi et al.

[11] 4,346,206

[45] Aug. 24, 1982

[54] IMIDE PREPOLYMER FROM REACTION OF EPOXY COMPOUND WITH BIS-IMIDE/DIAMINE REACTION MIXTURE

[75] Inventors: Akio Takahashi, Hitachioota; Yutaka Itoh, Hitachi; Takeshi Shimazaki, Hitachi; Motoyo Wajima, Hitachi; Hirosada Morishita, Hitachi; Yutaka Mizuno, Shimodate; Shunya Yokozawa, Oyama; Kenji Tsukanishi, Shimodate, all of Japan

[73] Assignee: Hitachi Chemical Company, Ltd., Tokyo, Japan

[21] Appl. No.: 176,740

[22] Filed: Aug. 11, 1980

[30] Foreign Application Priority Data

Aug. 17, 1979 [JP] Japan .................................. 54-105241

[51] Int. Cl.$^3$ ...................... C08G 59/40; C08G 73/10
[52] U.S. Cl. ...................................... 528/88; 525/422; 528/117; 528/142; 528/163; 528/317; 528/322
[58] Field of Search ................. 528/322, 317, 88, 117, 528/142, 163; 525/422

[56] References Cited

U.S. PATENT DOCUMENTS

| | | | |
|---|---|---|---|
| 3,637,901 | 1/1972 | Bargain et al. | 528/322 |
| 3,839,493 | 10/1974 | Balme et al. | 528/322 |
| 3,978,152 | 8/1976 | Gruffaz et al. | 528/322 |
| 4,005,154 | 1/1977 | Bargain | 528/322 |

*Primary Examiner*—Harold D. Anderson
*Attorney, Agent, or Firm*—Sprung, Horn, Kramer & Woods

[57] ABSTRACT

A process for preparing a thermosetting imide type prepolymer which comprises heating a bis-imide (A) and a diamine (B) in the presence of an organic solvent with a boiling point of 70° to 170° C. and heating the reaction mixture together with an epoxy compound (C). The imide type prepolymer prepared according to the process of the present invention has rapid curability and excellent solubility in low boiling point solvents such as acetone, methyl ethyl ketone and methyl cellosolve, which are available at low cost. Accordingly, the prepolymer is advantageously used especially for the production of laminated boards having good heat resisting properties, low moisture absorption and good adhesion to various substrates such as a copper foil.

3 Claims, No Drawings

IMIDE PREPOLYMER FROM REACTION OF EPOXY COMPOUND WITH BIS-IMIDE/DIAMINE REACTION MIXTURE

The present invention relates to a process for the preparation of an imide type prepolymer. More particularly, the invention relates to a process for preparing a thermosetting imide type prepolymer with high solubility in ordinary low boiling point organic solvents such as acetone, methyl ethyl ketone and methyl cellosolve, with rapid curability and with excellent physical properties after curing, such as excellent heat resisting properties, low moisture absorption and good adhesion to various substrates, e.g., a copper foil. Such a prepolymer may be used in a varnish for the impregnation of a base material in the manufacture of insulating laminated boards.

Bis-maleimide polymers have heretofore been used in printed circuit boards employed in the fields where high heat resistance and high environmental resistance are required thereof. Prepolymers from which such polyimide type resins are to be formed cannot dissolve in ordinary solvents other than special solvents such as N-methyl-2-pyrrolidone and N,N-dimethylformamide. These are highly dipolar and have high boiling points. They are also very costly. The use of such special solvents to form solutions of the prepolymers therefore presents various problems. For example, where such prepolymers are used in the form of solutions for the production of laminated boards, the following problems are encountered from the viewpoints of workability and the properties of the laminated boards. At the time of application of the solution to a base material such as glass cloth or paper, the solvent is splashed on workers and the splashed solvent is very slow in escaping from the workers because of its slow evaporation. Furthermore, an uneven surface of the so-called "prepreg" is liable to be formed in the course of prolonged drying. Unfavourable condensation of the solvent is also liable to occur on the inner wall of the dryer for the prepreg. A small amount of the solvent tends to remain in the laminated board, adversely affecting the characteristics of the board such as its moisture resistance (e.g., in respect of insulating properties) and heat resistance (in respect of flammability and the occurrence of cracking and/or blistering by heating, for example, at the time of any soldering operation). High temperatures and prolonged periods of time are required for complete drying of the prepreg, leading to increases in cost and time for the production of the laminated boards.

The present invention provides a solution to the above-mentioned problems. That is, the invention provides a process for preparing a thermosetting imide type prepolymer which can be dissolved in a low boiling point organic solvent of low cost such as acetone, methyl ethyl ketone or methyl cellosolve, leading to good workability. Furthermore, upon heat-curing the prepolymer which has rapid curability, a polyimide is formed, having excellent heat resisting properties comparable to those of the polyimides formed from the conventional imide type prepolymers. The polyimide is low in moisture absorption and good in adhesion to substrates such as a copper foil.

More specifically, in accordance with the present invention, there is provided a process for preparing an imide type prepolymer, which comprises the steps of:

(1) heating, at 70° to 170° C. for 5 to 120 minutes, at least one bis-imide (A) represented by the formula (a):

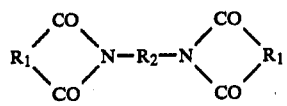

wherein $R_1$ stands for a divalent organic radical having a carbon-carbon double bond, and $R_2$ stands for a divalent organic radical having at least 2 carbon atoms, and at least one diamine (B) represented by the formula (b):

wherein $R_3$ stands for a divalent organic radical having at least 2 carbon atoms, in the presence of an organic solvent having a boiling point of 70° to 170° C. as measured under a pressure of 760 mmHg, said at least one bis-imide (A) and said at least one diamine (B) being employed at a molar ratio [(A):(B)] of from 1:0.1 to 1:1, to obtain a reaction mixture containing an intermediate reaction product which is insoluble or slightly soluble in a low boiling point organic solvent; and (2) further heating, at 50° to 140° c. for 5 to 120 minutes, the reaction mixture together with at least one 1,2-epoxy compound (C) having at least two epoxy groups, said at least one 1,2-epoxy compound (C) being employed in a weight proportion, relative to the total of said at least one bis-imide (A), said at least one diamine (B) and said at least one 1,2-epoxy compound (C), of from 10 to 80%, to obtain a reaction mixture containing an imide type prepolymer having an increased solubility in said low boiling point organic solvent.

In the process of the present invention, the bis-imide (A) is firstly reacted with the diamine (B) in an ordinary low boiling point organic solvent such as methyl cellosolve at a temperature of 70° to 170° C., preferably 80° to 140° C., more preferably 80° to 130° C., for 5 to 120 minutes, preferably 10 to 100 minutes, more preferably 20 to 60 minutes. The 1,2-epoxy compound (C) is then added to the reaction mixture which may be in the form of a solution at high temperatures but in the form of a suspension at room temperature because of the poor solubility of the intermediate reaction product. The resulting mixture is heated at 50° to 140° C., preferably 70° to 130° C., more preferably 80° to 120° C., for 5 to 120 minutes, preferably 10 to 100 minutes, more preferably 20 to 60 minutes, to obtain a reddish blown and transparent reaction mixture containing a prepolymer which may be either used by itself as a varnish or formulated into a suitable form of varnish. The use of the solvent in the practice of the process of the present invention is advantageous in that it provides a uniform advance of the reactions in the steps (1) and (2) and that it widens the scopes of the kinds and ratio of raw materials usable in the production of prepolymers because raw materials even in a solid state at reaction temperatures may be used in so far as they are soluble in the solvent at the reaction temperatures.

It is preferred that the intermediate reaction product obtained by reacting the bis-imide (A) with the diamine (B) have a weight average molecular weight of 400 to 800. When the weight average molecular weight is lower than 400, too large an amount of the unreacted bis-imide may remain in the reaction mixture, leading to a possibility that some amount of the unreacted bis-imide cannot be dissolved in an ordinary low boiling point organic solvent in the preparation of a varnish from the resulting prepolymer. When the average molecular weight is higher than 800, the intermediate reaction product may be so polymeric that the prepolymer obtained by further reacting the intermediate reaction product with the 1,2-epoxy compound (C) may be difficult to dissolve in ordinary low boiling point organic solvents such as acetone and methyl ethyl ketone.

For the same reason as mentioned above, it is also preferred that 1 mole of the intermediate reaction product obtained by reacting the bis-imide (A) with the diamine (B) contain 1.2 to 4.0 moles of total monomer units of the bis-imide (A) and the diamine (B).

It is preferred that at least 20% by weight of the 1,2-epoxy compound (C) used in the heating of the step (2) be consumed in the reaction thereof with the intermediate reaction product obtained by reacting the bis-imide (A) with the diamine (B).

The obtained prepolymer composed of bis-imide (A) monomer units, diamine (B) monomer units and 1,2-epoxy compound (C) monomer units is desired to have a gelation time of at least 120 seconds as measured at 160° C. when it is used in a varnish for the impregnation of a base material in the manufacture of insulating laminated boards.

The organic solvent to be used as the reaction solvent in the process of the present invention has a boiling point of 70° to 170° C. as measured under a pressure of 760 mmHg. Examples of the organic solvent to be used as the reaction solvent include 2-methoxyethanol (i.e. methyl cellosolve), 2-ethoxyethanol (i.e. ethyl cellosolve), 2-(methoxymethoxy)ethanol, 2-isopropoxyethanol, 2-(ethoxyethoxy)ethanol, 2-acetoxyethanol, 2-acetoxymethylethanol, dioxane, dimethyldioxane and propylene glycol monomethyl ether. They may be used either alone or in mixture. The organic solvent is usually used in an amount of 10 to 80% by weight based on the reaction mixture obtained in the step (2).

The mixing molar ratio of the bis-imide (A) relative to the diamine (B) is in the range of from 1:0.1 to 1:1, preferably in the range of from 1:0.2 to 1:0.5, in the process of the present invention. Where the above-mentioned molar ratio is less than 1:0.1, the solubility of the resulting prepolymer in low boiling point organic solvents tends to be unsatisfactory. Where the above-mentioned molar ratio is more than 1:1, the reaction proceeds too fast and, hence, it is so difficult to control the reaction that the resulting prepolymer may have too high a molecular weight.

The weight proportion of the 1,2-epoxy compound (C) relative to the total of the bis-imide (A), the diamine (B) and the 1,2-epoxy compound (C) is in the range of from 10 to 80%, preferably in the range of from 15 to 70%, more preferably in the range of from 25 to 60%, in the process of the present invention. Where the above-mentioned weight proportion is less than 10%, the solubility of the resulting prepolymer in low boiling point organic solvents tends to be unsatisfactory. Where the above-mentioned weight proportion is more than 80%, the resulting prepolymer, upon heat-curing, forms a polyimide which is poor in heat resisting properties and does not satisfy the requirements for being classified V-1 in tests for flammability according to Underwriters Laboratories' Standard-94 (vertical burning test).

The bis-imide (A) to be used in the process of the present invention and represented by the formula (a):

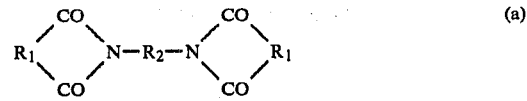

wherein $R_1$ stands for a divalent organic radical having a carbon-carbon double bond, and $R_2$ stands for a divalent organic radical having at least 2 carbon atoms, is derived from an ethylenically unsaturated dicarboxylic anhydride represented by the formula:

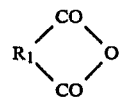

wherein $R_1$ is the same as defined above. As the bis-imide (A) which has ethylenic unsaturation, there can be mentioned, for example, N,N'-m-phenylene-bis-maleimide, N,N'-p-phenylene-bis-maleimide, N,N'-4,4'-diphenylmethane-bis-maleimide, N,N'-4,4'-diphenylether-bis-maleimide, N,N'-methylene-bis(3-chloro-p-phenylene)bis-maleimide, N,N'-4,4'-diphenylsulfone-bis-maleimide, N,N'-4,4'-dicyclohexylmethane-bis-maleimide, N,N'-α,α'-4,4'-dimethylenecyclohexane-bis-maleimide, N,N'-m-xylene-bis-maleimide, N,N'-4,4'-diphenylcyclohexane-bis-maleimide, N,N'-m-phenylene-bis-tetrahydrophthalimide and N,N'-4,4'-diphenylmethane-bis-citraconimide. They may be used either alone or in combination.

As diamine (B) to be used in the process of the present invention and represented by the formula (b):

wherein $R_3$ stands for a divalent organic radical having at least 2 carbon atoms, there can be mentioned, for example, 4,4'-diaminodicyclohexylmethane, 1,4-diaminocyclohexane, 2,6-diaminopyridine, m-phenylenediamine, p-phenylenediamine, 4,4'-diaminodiphenylmethane, 2,2'-bis(4-aminophenyl)propane, benzidine, 4,4'-diaminodiphenylsulfone, bis(4-aminophenyl)methylphosphine oxide, bis(4-aminophenyl)phenylphosphine oxide, bis(4-aminophenyl)methylamine, 1,5-diaminonaphthalene, m-xylylenediamine, p-xylylenediamine, hexamethylenediamine, 6,6'-diamino-2,2'-dipyridyl, 4,4'-diaminobenzophenone, 4,4'-diaminoazobenzene, bis(4-aminophenyl)phenylmethane, 1,1-bis(4-aminophenyl)cyclohexane, 1,1-bis(4-amino-3-methylphenyl)cyclohexane, 2,5-bis(m-aminophenyl)-1,3,4-oxadiazole, 2,5-bis(p-aminophenyl)-1,3,4-oxadiazole, 2,5-bis(m-aminophenyl)thiazolo(4,5-d)thiazole, 5,5'-di(m-aminophenyl)-2,2'-bis(1,3,4-oxadiazolyl),4,4'-diaminodiphenyl ether, 4,4'-bis(p-aminophenyl)-2,2'-dithiazole, m-bis(4-p-aminophenyl-2-thiazolyl)benzene, 4,4'-diaminobenzanilide, 4,4'-diaminophenyl benzoate, N,N'-bis(4-aminobenzyl)-p-phenylenediamine and 4,4'-methylenebis(2-chloroaniline). They may be used either alone or in combination.

As the 1,2-epoxy compound (C) with at least 2 epoxy groups to be used in the process of the present invention, there can be mentioned, for example, diepoxy compounds such as diglycidyl ether of bisphenol A, bisphenol A-epichlorohydrin epoxy resins, 3,4-epoxycyclohexylmethyl 3,4-epoxycyclohexanecarboxylate, 4,4'-(1,2-epoxyethyl)biphenyl, 4,4'-di(1,2-epoxyethyl)-diphenyl ether, resorcin glycidyl ether, bis(2,3-epoxycyclopentyl) ether and N,N'-m-phenylene-bis(4,5-epoxy-1,2-cyclohexanedicarboxyimide); and polyepoxy compounds such as N, N', N"-triglycidyl isocyanurate, 1,3,5-tri(1,2-epoxyethyl)benzene, tetra-p-glycidoxytetraphenylethane, and polyglycidyl eters of phenol-formaldehyde novolak resins and cresol-formaldehyde novolak resins. An epoxy compound having a hydantoin skeletal structure or a halogen-containing epoxy compound may also be used in the process of the present invention. Specific examples of the epoxy compound having a hydantoin skeletal structure include XB-2818 and XB-2793 (trade names of epoxy compounds manufactured by Ciba-Geigy AG, Switzerland). Specific examples of the halogen-containing epoxy compound include DER-542 and DER-511 (trade names of epoxy compounds manufactured by The Dow Chemical Company, U.S.A.); Araldite 8011 (trade name of an epoxy compound manufactured by Ciba-Geigy AG, Switzerland); and Epikote 1045 (trade name of an epoxy compound manufactured by Yuka Shell Epoxy K.K., Japan). The above-mentioned epoxy compounds may be used either alone or in combination. Where the epoxy compound is a polymeric compound, the weight average molecular weight thereof is preferably up to 2,000.

Since the imide type prepolymer prepared according to the process of the present invention can be dissolved very well in a low boiling point organic solvent such as methyl ethyl ketone or acetone which may be used for diluting the reaction mixture containing said prepolymer to prepare a varnish, the preparation of prepregs and copper-clad laminated boards therefrom can be carried out using this imide type prepolymer according to substantially the same procedures as employed for the preparation of ordinary epoxy type prepregs and copper-clad laminated boards therefrom which preparation is easy to carry out due to good workability. A varnish containing the prepolymer prepared according to the process of the present invention and a low boiling point solvent is hardly subject to sagging when applied to a base material unlike a varnish containing a conventional imide type prepolymer and a high boiling point solvent such as N-methyl-2-pyrrolidone, and contributes to a drastic decrease in amounts of volatile matters remaining in the prepregs and the copper-clad laminated boards prepared therefrom.

A low boiling point organic solvent such as methyl ethyl ketone or acetone may be added as a diluent either before or during preparation of the prepolymer according to the process of the present invention, or after the preparation of the prepolymer, for example after cooling of the reaction mixture or just before application of the prepolymer to a base material. However, the addition of such a solvent before or during preparation of the prepolymer may hold down the progress of the reaction in the step (2). Therefore, such a solvent is usually added to the reaction mixture after cooling the same or just before application thereof to the base material.

The solubility of the prepolymer prepared according to the process of the present invention may very depending on the kinds of raw materials from which the prepolymer has been prepared, the reaction conditions under which the preparation of the prepolymer has been carried out, the kind of organic solvent in which the prepolymer is to be dissolved, and so forth. However, the prepolymer prepared according to the process of the present invention can usually be dissolved in a low boiling point organic solvent such as acetone, methyl ethyl ketone or methyl cellosolve in such an amount as to form, at room temperature, a solution having a solids content of about 40% by weight or more.

A curing agent may be used in combination with the imide type prepolymer prepared according to the process of the present invention for improving curability of the prepolymer. As the curing agent, there can be mentioned, for example, dicyandiamide, guanidine, tetramethylguanidine and various diamines as mentioned as the diamine component (B) in the process of the present invention. The curing agent is usually used in an amount of 0.5 to 15 parts by weight per 100 parts by weight of the prepolymer.

For the measurement of a weight average molecular weight, there is adopted a gel permeation chromatography (GPC) method using, as standard samples, polystyrenes manufactured by Pressure Chemical Co., U.S.A. and as an apparatus, WATERS 200 manufactured by Japan-Waters Co., Japan.

The following Examples illustrate the present invention in more detail but should not be construed as limiting the scope of the invention.

EXAMPLE 1

50 Parts by weight of N,N'-4,4'-diphenylmethane-bis-maleimide and 10 parts by weight of 4,4'-diaminodiphenylmethane were heated together with 60 parts by weight of 2-methoxyethanol as a solvent at 120° to 130° C. for 30 minutes to effect the reaction. Then, 40 parts by weight of a cresol novolak type epoxy resin having an epoxy equivalent of 222 (EOCN-102S manufactured by Nihon Kayaku K.K., Japan) was added to the reaction mixture, and the resulting mixture was heated at 90° to 100° C. for 30 minutes. The resulting reaction mixture was cooled to room temperature, and 1.2 parts by weight of dicyandiamide and 41.2 parts by weight of methyl ethyl ketone were added thereto to prepare a varnish having a solids content of 50% by weight.

COMPARATIVE EXAMPLE 1

60 Parts by weight of an amino-bis-maleimide type prepolymer prepared from N,N'-4,4'-diphenylmethane-bis-maleimide and 4,4'-diaminodiphenylmethane (Kerimid 601 manufactured by Rhone-Poulenc S.A., France), 40 parts by weight of EOCN-102S and 1.2 parts by weight of dicyandiamide were dissolved in 101.2 parts by weight of N-methyl-2-pyrrolidone to prepare a varnish having a solids content of 50% by weight.

EXAMPLE 2

47 Parts by weight of N,N'-4,4'-diphenylmethane-bis-maleimide and 13 parts by weight of 4,4'-diaminodiphenylmethane were heated together with 60 parts by weight of 2-ethoxyethanol as a solvent at 120° to 130° C. for 30 minutes to effect the reaction. Then, 40 parts by weight of a bisphenol A-epichlorohydrin epoxy resin having an epoxy equivalent of 188 (Epikote 828 manufactured by Yuka Shell Epoxy K.K. Japan,) was added to the reaction mixture, and the resulting mixture was heated at 85° to 95° C. for 30 minutes. The resulting reaction mixture was cooled to room temperature, and 1.5 parts by weight of dicyaniamide and 41.5 parts by weight of methyl ethyl ketone were added thereto to prepare a varnish having a solids content of 50% by weight.

COMPARATIVE EXAMPLE 2

60 Parts by weight of Kerimid 601, 40 parts by weight of Epikote 828 and 1.5 parts by weight of dicyandiamide were dissolved in 101.5 parts by weight of N,N'-dimethylformamide to prepare a varnish having a solids content of 50% by weight.

EXAMPLE 3

55 Parts by weight of N,N'-4,4'-diphenylmethane-bis-maleimide, 10 parts by weight of 4,4'-methylenebis(2-chloroaniline) and 10 parts by weight of 4,4'-diaminodiphenylmethane were heated together with 60 parts by weight of 2-methoxyethanol as a solvent at 110° to 120° C. for 30 minutes to effect the reaction. Then, 35 parts by weight of a cresol novolak type epoxy resin having an epoxy equivalent of about 210 (ECN-1280 manufactured by Ciba-Geigy AG, Switzerland) was added to the reaction mixture, and the resulting mixture was heated at 85° to 95° C. for 30 minutes. The resulting reaction mixture was cooled to room temperature, and 50 parts by weight of methyl ethyl ketone was added thereto to prepare a varnish having a solids content of 50% by weight.

COMPARATIVE EXAMPLE 3

A varnish was prepared in substantially the same manner as in Example 3 except that N-methyl-2-pyrrolidone was used as the solvent instead of the mixture of 2-methoxyethanol and methyl ethyl ketone.

EXAMPLE 4

50 Parts by weight of N,N'-methylene-bis(3-chloro-p-phenylene)-bis-maleimide and 10 parts by weight of 4,4'-diaminodiphenylmethane were heated together with 60 parts by weight of 2-methoxyethanol as a solvent at 120° to 130° C. for 40 minutes. Then, 40 parts by weight of a phenol novolak type epoxy resin having an epoxy equivalent of about 180 (DEN-438 manufactured by The Dow Chemical Company, U.S.A.) was added to the reaction mixture, and the resulting mixture was heated at 85° to 95° C. for 30 minutes. 1.0 Part by weight of dicyandiamide was added to the reaction mixture, and the resulting mixture was cooled to room temperature. Then, 41.0 parts by weight of methyl ethyl ketone was added to the cooled mixture to prepare a varnish having a solids content of 50% by weight.

COMPARATIVE EXAMPLE 4

A varnish was prepared in substantially the same manner as in Example 4 except that N,N-dimethylformamide was used as the solvent instead of the mixture of 2-methoxyethanol and methyl ethyl ketone.

EXAMPLE 5

55 Parts by weight of N,N'-4,4'-diphenylmethane-bis-maleimide and 11 parts by weight of 4,4'-diaminodiphenylmethane were heated together with 70 parts by weight of 2-methoxyethanol as a solvent at 90° C. for 60 minutes to effect the reaction. Then, 34 parts by weight of DEN-438 was added to the reaction mixture, and the resulting mixture was heated at 85° to 95° C. for 30 minutes. The resulting reaction mixture was cooled to room temperature, and 0.8 parts by weight of dicyandiamide and 30.8 parts by weight of acetone were added thereto to prepare a varnish having a solids content of 50% by weight.

EXAMPLE 6

38 Parts by weight of N,N'-m-phenylene-bis-maleimide and 15 parts by weight of 2,2'-bis(4-aminophenyl)-propane were heated together with 55 parts by weight of 2-(methoxymethoxy) ethanol as a solvent at 110° to 120° C. for 30 minutes to effect the reaction. Then, 47 parts by weight of an epoxy compound having a hydantoin skeletal structure and an epoxy equivalent of 163 (XB-2818 manufactured by Ciba-Geigy AG, Switzerland) was added to the reaction mixture, and the resulting mixture was heated at 70° to 90° C. for 40 minutes. The resulting reaction mixture was cooled to room temperature, and 1.5 parts by weight of guanidine and 46.5 parts by weight of methyl ethyl ketone were added thereto to prepare a varnish having a solids content of 50% by weight.

EXAMPLE 7

45 Parts by weight of N,N'-m-xylene-bis-maleimide and 10 parts by weight of m-phenylenediamine were heated together with 55 parts by weight of 2-methoxyethanol as a solvent at 100° to 120° C. for 30 minutes to effect the reaction. Then, 45 parts by weight of Epikote 828 was added to the reaction mixture, and the resulting mixture was heated at 80° to 100° C. for 30 minutes. The resulting reaction mixture was cooled to room temperature, and 10 parts by weight of 4,4'-diaminodiphenylmethane and 55 parts by weight of methyl ethyl ketone were added thereto to prepare a varnish having a solids content of 50% by weight.

Laminated boards were prepared by using the varnishes prepared in Examples 1 to 7 and Comparative Examples 1 to 4, respectively, in the following manner.

Eight strips of 0.18 mm-thick aminosilane-treated glass cloth WE-18G-104BX (trade name of a glass cloth manufactured by Nittobo K.K., Japan) were impregnated with the varnish, followed by drying at 130° to 150° C. in the case of each varnish prepared in Examples or at 140° to 160° C. in the case of each varnish prepared in Comparative Examples for 10 minutes, to prepare eight strips of a prepreg having a resin content of 41 to 42% by weight. The eight strips of the prepreg which had been interposed in contact relationship between two pieces of 35μ-thick electrolytic copper foil (manufactured by Furukawa Circuit Foil Co., Ltd., Japan) were contact-bonded at 170° C. under a pressure of 40 Kg/cm² for 80 minutes to prepare a copper-clad laminated board having a thickness of 1.6 mm.

The properties of the prepregs were as shown in Table 1. It will be apparent from Table 1 that the volatile contents in the prepregs produced by using each varnish prepared in Examples according to the present invention are very low and comparable to those in ordinary epoxy type prepregs.

TABLE 1

| | Resin Content (%) | Gelation Time at 170° C. (seconds) | Volatile Content (%) | Amount of Resin Flowed Out (%) |
| --- | --- | --- | --- | --- |
| Example 1 | 41-42 | 120 | 0.21 | 15.5 |
| Example 2 | 41-42 | 135 | 0.20 | 17.0 |
| Example 3 | 41-42 | 160 | 0.20 | 16.0 |
| Example 4 | 41-42 | 175 | 0.21 | 18.0 |
| Example 5 | 41-42 | 125 | 0.20 | 16.5 |
| Example 6 | 41-42 | 95 | 0.20 | 17.5 |

TABLE 1-continued

|  | Resin Content (%) | Gelation Time at 170° C. (seconds) | Volatile Content (%) | Amount of Resin Flowed Out (%) |
|---|---|---|---|---|
| Example 7 | 41–42 | 110 | 0.21 | 17.5 |
| Comparative Example 1 | 41–42 | 135 | 0.80 | 16.0 |
| Comparative Example 2 | 41–42 | 140 | 0.75 | 17.0 |
| Comparative Example 3 | 41–42 | 160 | 0.75 | 16.5 |
| Comparative Example 4 | 41–42 | 180 | 0.80 | 17.5 |

Note
(1) The volatile content was calculated according to the following formula:

Volatile content (%) = $\frac{H - I}{H} \times 100$ wherein H stands for the weight (g) of the prepreg before heating it, and I stands for the weight (g) of the prepreg after heating it at 170° C. for 30 minutes.
(2) The amount of resin flowed out was calculated according to the following formula:

Amount of resin flowed out (%) = $\frac{J - K}{J} \times 100$ wherein J stands for the weight (g) of the prepreg before pressing it, and K stands for the weight (g) of the prepreg after pressing it at 170° C. under 14 Kg/cm² for 5 minutes.

With respect to each of the 1.6 mm-thick copper-clad laminated boards, the change in flexural strength with temperature and the change in flexural strength with time of heating (heat deterioration characteristics) were examined. The laminated boards produced by using each of the varnishes prepared in Examples were found to be comparable in heat resisting properties to those produced by using each of the varnishes prepared in Comparative Examples. All the laminated boards satisfied the requirements for being classified as having class H insulation properties according to JIS C 4003 (resistant to a temperature of 180° C.)

With respect to each of the 1.6 mm-thick copper-clad laminated boards, the thermal resistance to soldering at 300° C., 320° C. and 340° C. and flammability were examined and the results obtained were as shown in Table 2.

TABLE 2

|  | Thermal Resistance to Soldering | | | Flammability | | |
|---|---|---|---|---|---|---|
|  | 300° C. | 320° C. | 340° C. | Average Flaming Combustion Time (seconds) | Maximum Flaming Combustion Time (seconds) | Class |
| Example 1 | O | O | O | 16 | 23 | V-1 |
| Example 2 | O | O | O | 14 | 22 | V-1 |
| Example 3 | O | O | O | 7 | 12 | V-1 |
| Example 4 | O | O | O | 5 | 9 | V-0 |
| Example 5 | O | O | O | 8 | 15 | V-1 |
| Example 6 | O | O | O | 13 | 20 | V-1 |
| Example 7 | O | O | O | 16 | 25 | V-1 |
| Comparative Example 1 | O | O | X | 21 | 36 | HB |
| Comparative Example 2 | O | O | X | 19 | 33 | HB |
| Comparative Example 3 | O | X | X | 13 | 19 | V-1 |
| Comparative Example 4 | O | O | X | 11 | 17 | V-1 |

Note
(1) The thermal resistance to soldering was determined in the following manner. The laminated board was floated on a soldering bath maintained at each of 300° C., 320° C. and 340° C. for 60 seconds, and whether or not blistering and/or any other change appeared in the laminated board was examined. Laminated boards in which neither blistering nor any other change was observed were marked by O, and laminated boards in which blistering and/or any other change was observed were marked by X.
(2) The flammability was examined according to Underwriters Laboratories' Standard-94 (vertical burning test).

What is claimed is:
1. A process for preparing an imide prepolymer, which comprises the steps of:

(1) heating, at 70° to 170° C. for 5 to 120 minutes, at least one bis-imide (A) represented by the formula (a):

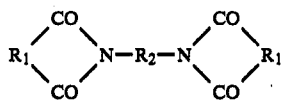
(a)

wherein $R_1$ stands for a divalent organic radical having a carbon-carbon double bond, and $R_2$ stands for a divalent organic radical having at least 2 carbon atoms, and at least one diamine (B) represented by the formula (b):

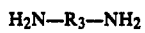 (b)

wherein $R_3$ stands for a divalent organic radical having at least 2 carbon atoms, in an organic solvent having a boiling point of 70° to 170° C. as measured under a pressure of 760 mmHg, said at least one bis-imide (A) and said at least one diamine (B) being employed at a molar ratio of the component (A) to the component (B) of from 1:0.1 to 1:1, to obtain a reaction mixture containing an intermediate reaction product which is insoluble or slightly soluble in a low boiling point organic solvent, said solvent having a boiling point no higher than about that of methyl ethyl ketone; and (2) further heating, at 50° to 140° C. for 5 to 120 minutes, the reaction mixture together with at least one 1,2-epoxy compound (C) having at least two 1,2-epoxy groups, said at least one 1,2-epoxy compound (C) being employed in a weight proportion, relative to the total of said at least one bis-imide (A), said at least one diamine (B) and said at least one 1,2-epoxy compound (C), of from 10 to 80%, to obtain a reaction mixture containing an imide prepolymer having an increased solubility relative to that of said intermediate reaction product in said low boiling point organic solvent.

2. A process according to claim 1, wherein said solvent having a boiling point of 70° to 170° C. is 2-methoxyethanol, 2-ethoxyethanol, 2-(methoxymethoxy)ethanol, 2-isopropoxyethanol or a mixed solvent thereof.

3. An imide prepolymer produced by a process according to claim 1.

* * * * *